(12) United States Patent
Pierson

(10) Patent No.: US 6,708,871 B2
(45) Date of Patent: Mar. 23, 2004

(54) METHOD FOR FORMING SOLDER CONNECTIONS ON A CIRCUITIZED SUBSTRATE

(75) Inventor: Mark Vincent Pierson, Binghamton, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/041,392

(22) Filed: Jan. 8, 2002

(65) Prior Publication Data

US 2003/0127500 A1 Jul. 10, 2003

(51) Int. Cl.[7] .......................... B23K 37/06; B23K 5/00; H01L 21/4763
(52) U.S. Cl. .......................... 228/246; 228/33; 228/178; 228/39; 438/612
(58) Field of Search ............................. 228/246, 250, 228/252, 185.22, 178, 203, 33–39; 438/612

(56) References Cited

U.S. PATENT DOCUMENTS

| | | | |
|---|---|---|---|
| 5,445,311 A | * 8/1995 | Trask et al. | 228/175 |
| 5,473,120 A | * 12/1995 | Ito et al. | 174/264 |
| 5,478,700 A | * 12/1995 | Gaynes et al. | 430/315 |
| 5,668,405 A | * 9/1997 | Yamashita | 257/668 |
| 5,721,007 A | * 2/1998 | Lynch et al. | 427/98 |
| 5,947,021 A | * 9/1999 | Coleman et al. | 101/120 |
| 6,150,726 A | * 11/2000 | Feilchenfeld et al. | 257/784 |
| 6,170,394 B1 | * 1/2001 | Kinoshita | 101/129 |
| 6,180,504 B1 | * 1/2001 | Farnworth et al. | 438/612 |
| 6,194,024 B1 | * 2/2001 | Arldt et al. | 427/97 |
| 6,261,671 B1 | * 7/2001 | Asai et al. | 428/206 |
| 6,338,936 B1 | * 1/2002 | Ichikawa et al. | 430/285.1 |
| 6,468,892 B1 | * 10/2002 | Baker et al. | 438/612 |

* cited by examiner

Primary Examiner—L. Edmondson
(74) Attorney, Agent, or Firm—William N. Hogg

(57) ABSTRACT

A method of forming solder connections on a circuitized substrate having connection pads is provided. A laser ablatable solder mask material, preferably an epoxy, is degassed and then dispensed as a liquid onto the substrate over the circuitization. The surface of the solder mask material as applied is leveled, and the solder mask material is then cured to form a solder mask. Openings are laser ablated in the solder mask material to reveal those connection pads which are to receive solder to form the solder connections. Liquid solder is dispensed under pressure in a confined space into the openings as blades move laterally on top of the solder mask to fill the openings in the solder mask. The solder material is then solidified to form domed solder bumps in the openings.

20 Claims, 2 Drawing Sheets

METHOD FOR FORMING SOLDER CONNECTIONS ON A CIRCUITIZED SUBSTRATE

BACKGROUND INFORMATION

1. Field of the Invention

This invention relates generally to forming solder connections on a circuitized substrate and, more particularly, to a method of forming solder connections on a circuitized substrate having connection pads and circuitry on the substrate, with a solder mask formed of laser ablatable material overlying the pads, and dispensing liquid solder onto the pads.

2. Background of the Invention

Mounting of integrated circuit chips (I/C chips) on circuitized substrates is well known in the art. This mounting takes several forms. In one form, the circuitized substrate is provided having contact pads thereon which connect to the remainder of the circuitization on the substrate. The I/C chips are mounted to the pads by flip chip bonding, using C4 solder joints. A solder mask is applied over the pads and the substrate and, in one embodiment, the solder mask is in the form of a photopatternable or photoimageable epoxy. After the solder mask has been photoimaged and developed to form openings in the solder mask overlying the pads, solder is applied by various techniques to the pads revealed by the formed openings. This form, while appropriate for many applications, has certain limitations when used for certain other applications. First, it is difficult to define small features and pitches precisely by photoimaging. Moreover, the uneven exposed surface of the solder masks, coupled with the variation in size of the photoformed openings, makes it difficult to apply a precise amount of solder to the underlying pads, especially in circuitized substrates having very small features and pitches of lines and pads. Therefore, it is desirable to have a technique of applying solder to the pads on a circuitized substrate wherein a precise amount of solder can be applied and which is applicable to fine line and fine pitch technology.

SUMMARY OF THE INVENTION

According to the present invention, a method of forming solder connections on a circuitized substrate is provided. This method includes the steps of providing a circuitized substrate, which circuitization includes a plurality of connection pads. A laser ablatable solder mask material is degassed and then dispensed preferably in paste form onto the substrate over the circuitization; preferably, the solder mask material is an epoxy. The surface of the solder mask material as applied is leveled, preferably with a PTFE coated glass plate, and the solder mask material is then cured to form a solder mask. Openings are laser ablated in the solder mask material to reveal those connection pads which are to receive solder to form the solder connections. Liquid solder is dispensed under pressure in a confined space into the openings as blades move laterally on top of the solder mask to fill the openings to the height of the openings in the solder mask. The solder material is then solidified to form domed solder bumps in the openings extending above the solder mask material.

DESCRIPTION OF THE PREFERRED EMBODIMENT

Figure 1:
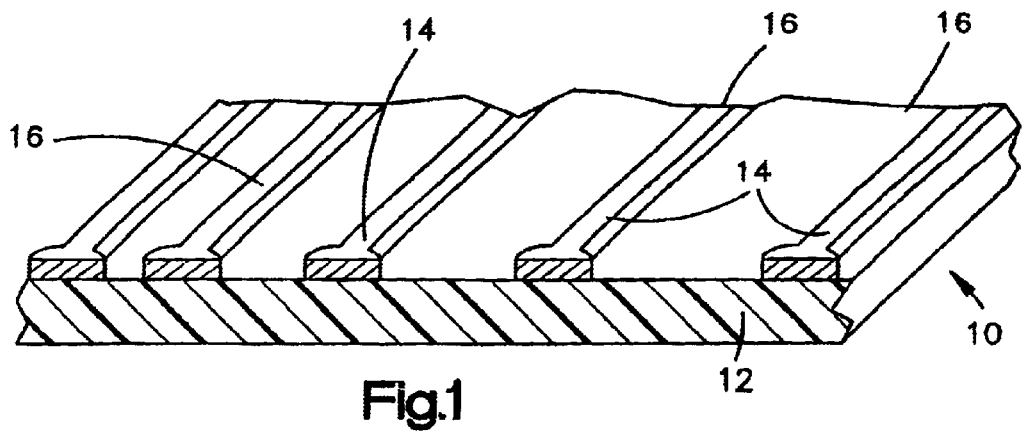
FIG. 1 is a perspective view in section, somewhat schematic, showing a portion of a circuitized substrate to have solder connections formed thereon according to the present invention.

Referring now to the drawings and, for the present to FIG. 1, a circuitized card or board 10 is shown which includes an organic substrate 12 which can be an epoxy impregnated fiberglass, such as an FR4 or polyimide, polytetrafluoroethylene (PTFE) or other organic material which will withstand the heat of liquid solder and curing temperature of solder mask material, as will be described presently. The substrate 12 has formed thereon circuitization which includes contact pads 14 and circuit lines 16. These can be formed in any conventional manner, such as by additive plating or subtractive processes. These circuitized lines preferably are formed of copper. The circuitized substrate is preferably heated to 125° C. to thoroughly dry it of any water residue.

Figure 2:
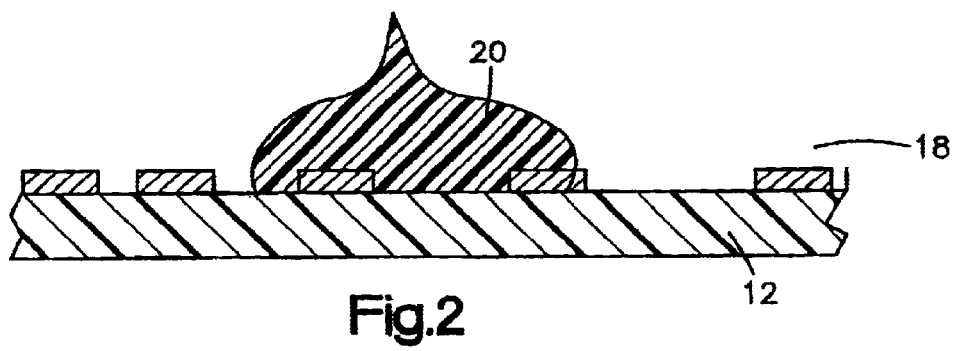
FIG. 2 is a sectional view of the substrate shown in FIG. 1 having a drop of liquid epoxy applied to the center of the chip site on the substrate.

After being degassed by conventional means, such as by applying a vacuum, a solder mask material 18 is applied as a drop to the dried substrate 12 at the center of a chip site (unnumbered), as shown in FIG. 2. The solder mask material 18 is applied in a liquid or paste form, such that it is flowable. As used herein, liquid form is intended to mean a form, including paste form, in which the solder mask material 18 can be flowed onto the substrate, maintain its presence on the substrate, and be amenable to flowing such as by a flattening action. A particularly useful material is a two-part epoxy such as #1838 B/A manufactured by 3M Corporation. It is to be understood that other materials, including other epoxies which can be laser ablated with precision, for purposes which will be described presently, can be used. The material must have the characteristics of a solder mask material when cured since the solder will be applied, as will be described presently. Exposed surface 20 of the solder mask material 18 as applied is generally drop shaped, as shown in FIG. 2.

Figure 3:
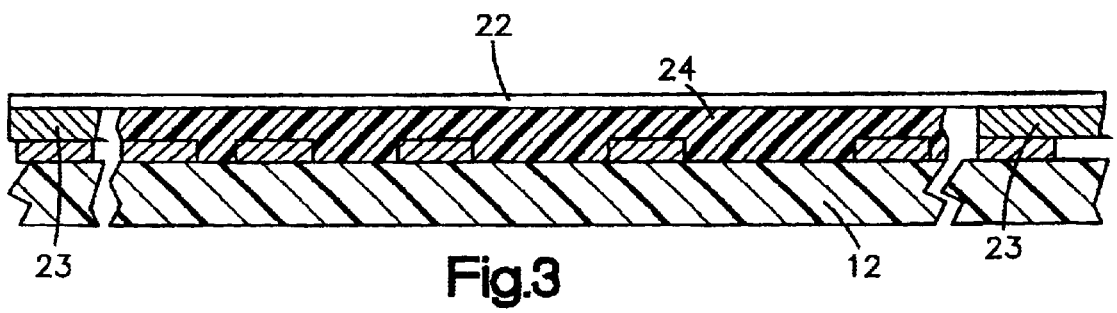
FIG. 3 is a view similar to FIG. 2 showing a PTFE coated glass plate leveling the solder mask material which has been applied.

While the solder mask material 18 is still in the liquid pliable form. it is smoothed by pressing a flat PTFE (polytetrafluoroethylene) coated glass plate, with standoffs 23, against the surface 20 of the material 18, as shown in FIG. 3, to form a straight, even, uniform, level surface 24, above the top of the circuitization 16 and contact pads 14 on the substrate 12. The PTFE is preferred to provide a nonstick surface; however, other nonstick materials could be used. The standoffs 23 determine the thickness of the epoxy 18. Preferably, the circuitization and pads 16 and 14 are about 1 mil thick and the epoxy material 18, after being smoothed, has a thickness of about 2 mils. Thus, the surface 24 extends about 1 mil above the circuitization 16 and pads 14, all as shown in FIG. 3. It is to be understood, however, that the thickness of the epoxy will vary as the pitch (distance between pads 14) varies, and preferably is in the ratio of 1:3 to 1:6.

Figure 4:
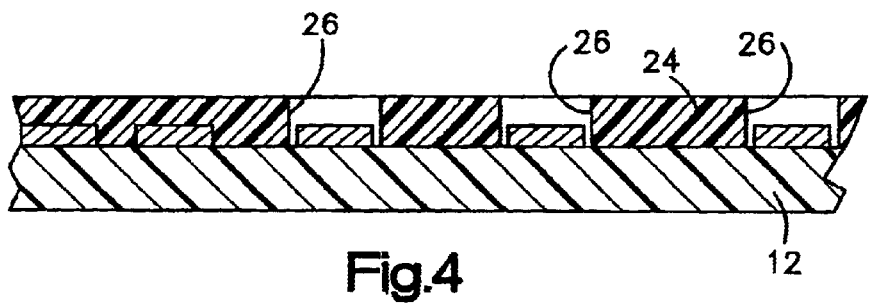
FIG. 4 is a view similar to FIG. 3 showing a cured solder mask material and having openings in the solder mask laser ablated above the connection pads.

After flattening, and with the glass plate 22 in place, the epoxy 18 is C-stage cured, which means that it is cured to at least 90% of full cure by heating the substrate with the applied epoxy 18 to 90° C. for one hour. At this stage, the liquid solder mask material 18 has become an effective solid solder mask which will resist the effects of solder being applied thereto. Following the C-stage cure, openings 26 are laser ablated, preferably with a $CO_2$ laser, into the cured solder mask material 18, as shown in FIG. 4. The openings are preferably uniform in size, and preferably about 4 mils in diameter and spaced on about 6 mil centers. At this stage in the processing, the circuitized substrate 10 with the cured solder mask material 18 disposed thereon is ready to have solder material dispensed onto the contact pads 14. This is accomplished as shown somewhat diagrammatically in FIG. 5.

Figure 5:
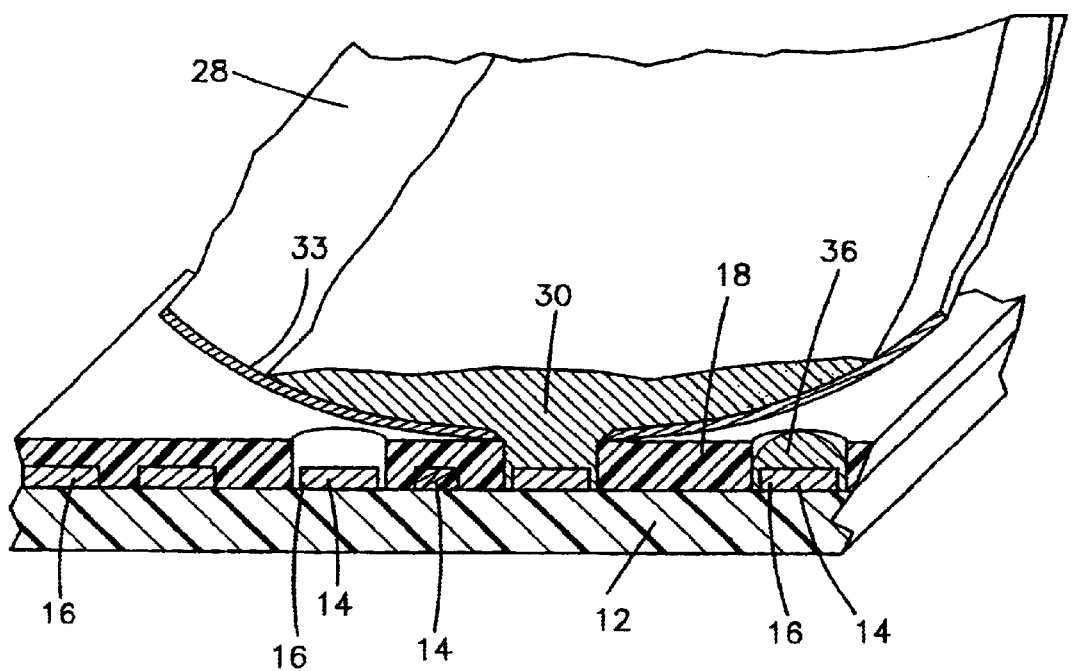
FIG. 5 is a perspective view showing the application of liquid solder to the circuitized substrate through the openings formed in the solder mask material.

As shown in FIG. 5, liquid solder is applied into the openings 26 through a solder application head 28. Liquid solder 30 is maintained in the application head 28 under pressure, preferably from nitrogen gas in the space 32 within the application head 28. The solder is delivered to the head by a feeding apparatus (not shown). For example, round solder wire could be indexed and led through a Viton O-ring that seals the pressure inside the head and above the solder in the space 32. The application head 28 includes a pair of spaced, flexible wiper blades 33, which blades preferably are formed of blue spring steel coated with titanium nitride, that bear against the surface 24 of the solder mask material 18. This will seal the liquid solder 30 between the two blades 33 and the surface 24 of the solder mask 18. As the application head 28 travels across the surface 24 and the blades 33 are in contact with the surface 24, an exact amount of solder 34 fills each opening. This amount is the solder 34 that is filled within each opening 26, as shown in FIG. 5. As the application head 28 moves across the surface 24, it wipes the molten solder so that it is flat across the top surface 24. After the head 28 has passed the liquid solder 34 in each opening 24 and upon exposure to ambient, the solder 34 in each opening 24 will solidify and, due to the surface tension, will solidify into a hemispherical solid shape 36, as shown in FIG. 5. Thus, when the application head 28 has completely traversed the circuitized substrate 10, solder will have been applied into each opening 26, which has been created in the solder mask, and the solider will solidify to form solder balls 36. These are then used to connect to an I/C chip or to other structures.

The particular composition of solder that is used can be any solder that melts at a temperature low enough not to adversely affect either the solder mask 18 or the substrate 12. It is preferred that a lead tin eutectic solder be utilized since this has a very low melting point and is compatible with many different substrates and solder masks. However, low melting lead-free solders are also very useful if lead content is to be avoided.

Accordingly, the preferred embodiments of the present invention have been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A method of forming solder balls on a circuitized substrate comprising the steps of:
   providing a circuitized substrate having a pluarlity of connection pads thereon;
   providing a laser ablatable solder mask material in a liquid dispersible form, which can be cured to form a solid solder mask;
   dispensing said solder mask material onto said substrate over said circuitization;
   leveling the exposed surface of said solder mask material;
   curing said solder mask material to form a solder mask;
   laser ablating said solder mask to form openings revealing said connection pads;
   dispensing liquid solder into said openings to a height of said openings in said solder mask; and
   solidifying said liquid solder to form domed solder bumps in said openings.

2. The invention as defined in claim 1 wherein said liquid solder is dispersed from a solder head under pressure.

3. The invention as defined in claim 2 wherein said solder head includes a wiper to level said liquid solder with the top of the opening in which it had been dispensed.

4. The invention as defined in claim 3 wherein said solder head is moved over the exposed surface of said solder mask past said openings.

5. The invention as defined in claim 1 wherein said solder mask material is a liquid epoxy that is curable to form said solder mask.

6. The invention as defined in claim 3 wherein said wiper includes flexible blades.

7. The invention as defined in claim 6 wherein said flexible blades are blue spring steel coated with titanium nitride.

8. The invention as defined in claim 1 wherein the solder a lead/tin eutectic.

9. The invention of claim 1 wherein said solder is lead free.

10. The invention as defined in claim 1 wherein said solder mask material is leveled with a flat plate of material having a nonstick surface.

11. The invention as defined in claim 10 wherein said flat plate of material is PTFE coated.

12. A method of forming solder balls on a circuitized substrate comprising the steps of:
    providing a circuitized substrate having a plurality of connection pads thereon;
    providing a laser ablatable solder mask epoxy material in a liquid dispersible form, which can be cured to form a solid solder mask;
    dispensing said solder mask material onto said substrate over said circuitization;
    leveling the exposed surface of said solder mask material with a flat plate of nonstick material;
    curing said solder mask material to form a solder mask;
    laser ablating said solder mask to form openings revealing said connection pads;
    dispensing liquid solder into said openings under pressure from a solder head moving over the exposed surface of the cured solder mask, and providing flexible wiper blades which contact the exposed surface of the cured solder mask to wipe the solder to a height of said openings in said solder mask; and
    solidifying said liquid solder to form domed solder bumps in said openings.

13. The invention as defined in claim 12 wherein said flexible blades are blue spring steel coated with titanium nitride.

14. The invention as defined in claim 12 wherein the solder a lead/tin eutectic.

15. The invention of claim 12 wherein said solder is lead free.

16. The invention as defined in claim 12 wherein said flat plate of material is PTFE coated.

17. A method of forming solder balls on a circuitized substrate comprising the steps of:
   providing a circuitized substrate having a plurality of connection pads thereon;
   providing a laser ablatable solder mask epoxy material in a liquid dispersible form, which can be cured to form a solid solder mask;
   dispensing said solder mask material onto said substrate over said circuitization;
   leveling the exposed surface of said solder mask material with a flat plate coated with PTFE;
   curing said solder mask material to form a solder mask;
   laser ablating said solder mask to form openings revealing said connection pads;
   dispensing liquid solder into said openings under pressure from a solder head moving over the exposed surface of the cured solder mask, and providing flexible, titanium nitride coated steel wiper blades which contact the exposed surface of the cured solder mask to wipe the solder to a height of said openings in said solder mask; and
   solidifying said liquid solder to form domed solder bumps in said openings.

18. A method of forming solder balls on a circuitized substrate comprising the steps of:
   providing a circuitized substrate having a plurality of connection pads thereon;
   providing a laser ablatable solder mask material in a liquid dispersible form, which is a degassed liquid epoxy that can be cured to form a solid solder mask;
   dispensing said solder mask material onto said substrate over said circuitization;
   leveling the exposed surface of said solder mask material;
   curing said solder mask material to form a solder mask;
   laser ablating said solder mask to form openings revealing said connection pads;
   dispensing liquid solder into said openings to a height of said openings in said solder mask; and
   solidifying said liquid solder to form domed solder bumps in said openings.

19. A method of forming solder balls on a circuitized substrate comprising the steps of:
   providing a circuitized substrate having a plurality of connection pads thereon;
   providing a laser ablatable solder mask material in a liquid dispersible form, which can be cured to form a solid solder mask;
   dispensing said solder mask material onto said substrate over said circuitization;
   leveling the exposed surface of said solder mask material with a flat plate of material comprised of PTFE coated on a glass material;
   curing said solder mask material to form a solder mask;
   laser ablating said solder mask to form openings revealing said connection pads;
   dispensing liquid solder into said openings to a height of said openings in said solder mask; and
   solidifying said liquid solder to form domed solder bumps in said openings.

20. A method of forming solder balls on a circuitized substrate comprising the steps of:
   providing a circuitized substrate having a plurality of connection pads thereon;
   providing a laser ablatable solder mask degassed epoxy material in a liquid dispersible form, which can be cured to form a solid solder mask;
   dispensing said solder mask material onto said substrate over said circuitization;
   leveling the exposed surface of said solder mask material with a flat plate of nonstick material;
   curing said solder mask material to form a solder mask;
   laser ablating said solder mask to form openings revealing said connection pads;
   dispensing liquid solder into said openings under pressure from a solder head moving over the exposed surface of the cured solder mask, and providing flexible wiper blades which contact the exposed surface of the cured solder mask to wipe the solder to a height of said openings in said solder mask; and
   solidifying said liquid solder to form domed solder bumps in said openings.

* * * * *